(12) United States Patent
Croffie

(10) Patent No.: US 7,494,752 B2
(45) Date of Patent: Feb. 24, 2009

(54) METHOD AND SYSTEMS FOR UTILIZING SIMPLIFIED RESIST PROCESS MODELS TO PERFORM OPTICAL AND PROCESS CORRECTIONS

(75) Inventor: Ebo H. Croffie, Portland, OR (US)

(73) Assignee: LSI Corporation, Milpitas, CA (US)

( * ) Notice: Subject to any disclaimer, the term of this patent is extended or adjusted under 35 U.S.C. 154(b) by 769 days.

(21) Appl. No.: 11/056,838

(22) Filed: Feb. 11, 2005

(65) Prior Publication Data
US 2006/0183039 A1    Aug. 17, 2006

(51) Int. Cl.
*G03C 5/00*    (2006.01)
*G03F 9/00*    (2006.01)

(52) U.S. Cl. .......................................... 430/30; 430/330
(58) Field of Classification Search .................. 430/30, 430/330
See application file for complete search history.

(56) References Cited

OTHER PUBLICATIONS

Croffie, E., "Simulation Tools for Optical Resist Models (STORM)", Ph.D. Thesis, Memorandum No. UCB/ERL M01/29, University of California, Berkely, Aug. 2001, pp. 26-35.

*Primary Examiner*—Christopher G Young
(74) *Attorney, Agent, or Firm*—Trexler, Bushnell, Giangiorgi & Blackstone, Ltd.

(57) ABSTRACT

A method and system for utilizing a simplified resist process model to perform optical and process corrections. More specifically, the present invention provides a fast and easy post exposure bake (PEB) effects calculation which can be used in connection with OPC. The model can be used to increase OPC modeling accuracy, by taking PEB effects into consideration, without incurring a large overhead increase due to PEB calculation cost. The method includes providing an image, calculating initial acid concentration and adding acid concentration contours to the image, calculating deprotection concentration and adding deprotection concentration contours to the image, determining latent image contour without diffusion, moving the latent image contour in a direction of lower deprotection concentration to provide the final latent image, performing OPC on the chemically amplified resist using edge movement based on the final latent image, and repeating the process to obtain convergence.

13 Claims, 2 Drawing Sheets

METHOD AND SYSTEMS FOR UTILIZING SIMPLIFIED RESIST PROCESS MODELS TO PERFORM OPTICAL AND PROCESS CORRECTIONS

BACKGROUND

The present invention generally relates to optical and process correction (OPC) in photolithography, and more specifically relates to a method and system for utilizing simplified resist process models to perform optical and process corrections.

Making a semiconductor device, such as an integrated circuit (IC), involves using photolithography to form patterns on a wafer, where the patterns correspond to complex circuitry. During the process, the patterns are initially formed on a reticle or mask, and then the patterns are exposed on the wafer by shining a light through, or illuminating, the mask.

During the optical lithography step in integrated circuit fabrication, a device structure is patterned by imaging a mask onto a radiation sensitive film (photoresist or resist) coating different thin film materials on the wafer. These photoresist films capture the pattern delineated through initial exposure to radiation and allow subsequent pattern transfer to the underlying layers. During exposure, depth of focus (DOF) indicates the range of distances around a focal plane where the image quality is sharp. It is important to optimize the illumination of a mask to achieve maximum common DOF, as this results in the best exposure of the wafer. The radiation source, imaging optics, mask type and resist performance determine the minimum feature size that can be reproduced by the lithography process. Imaging of mask patterns with critical dimensions smaller than the exposure wavelength results in distorted images of the original layout pattern, primarily because of optical proximity effects of the imaging optics. Nonlinear response of the photoresist to variability in exposure tool and mask manufacturing process as well as variability in resist and thin film processes also contribute to image distortion. These distortions include variations in the line-widths of identically drawn features in dense and isolated environments (iso-dense bias), line-end pullback or line-end shortening from drawn positions and corner rounding.

Mask error factor limits the amount of a common process window which is useable. Optical Proximity Correction or Optical and Process Correction (OPC) is common in the industry and involves the pre-compensation of predicted defects of a circuit design. OPC is a procedure of pre-distorting the mask layout by using simple shape manipulation rules (rule-based OPC) or fragmenting the original polygon into line segments and moving these segments to favorable positions as determined by a process model (model-based OPC). Using OPC improves image fidelity on a wafer. As the semiconductor industry pushes to resolve smaller critical dimensions, the need to provide more accurate OPC modeling becomes critical.

Deep ultra-violet (DUV) lithography normally uses chemically amplified (CA) resists. These systems contain a photoacid generator compound that decomposes when exposed to light. While a post exposure bake (PEB) step is not required for processes in which a soft resist is desired (e.g., metal liftoff patterning), a post exposure bake is needed for acid etching, e.g. BOE. Post exposure bake also introduces some stress into the photoresist. Additionally, some shrinkage of the photoresist may occur. During post exposure bake (PEB), the acid decomposition product induces a cascade of chemical transformations, changing the solubility of exposed regions.

Because the post exposure bake process effects the resist, it must can taken into account in advance when performing OPC. There are CA photoresist process modeling accuracy issues for OPC applications. One current approach includes diffused aerial image modeling. However, typically the photoresist process exhibits non-linear reaction/diffusion mechanisms that diffused aerial image models cannot simulate. Another approach includes variable threshold modeling, but this requires a large set of data for calibration. Still another approach includes using full resist process models. However, full physical resist process model calculations are generally too slow for OPC calculations.

OBJECTS AND SUMMARY

An object of an embodiment of the present invention is to provide a method and system for utilizing simplified resist process models to perform optical and process corrections.

Another object of an embodiment of the present invention is to provide a fast and easy post exposure bake (PEB) effects calculation for OPC calculations.

Still another object of an embodiment of the present invention is to provide a method and system which will improve OPC modeling accuracy without a large overhead increase with regard to the PEB calculation cost.

Briefly, an embodiment of the present invention provides a method of performing OPC on a chemically amplified resist in photolithography. The method includes providing an image, calculating initial acid concentration and adding acid concentration contours to the image, calculating deprotection concentration and adding deprotection concentration contours to the image, determining latent image contour without diffusion, moving the latent image contour in a direction of lower deprotection concentration to provide the final latent image, performing OPC on the chemically amplified resist using edge movement based on the final latent image, and repeating the process to obtain convergence.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

Figure 1:
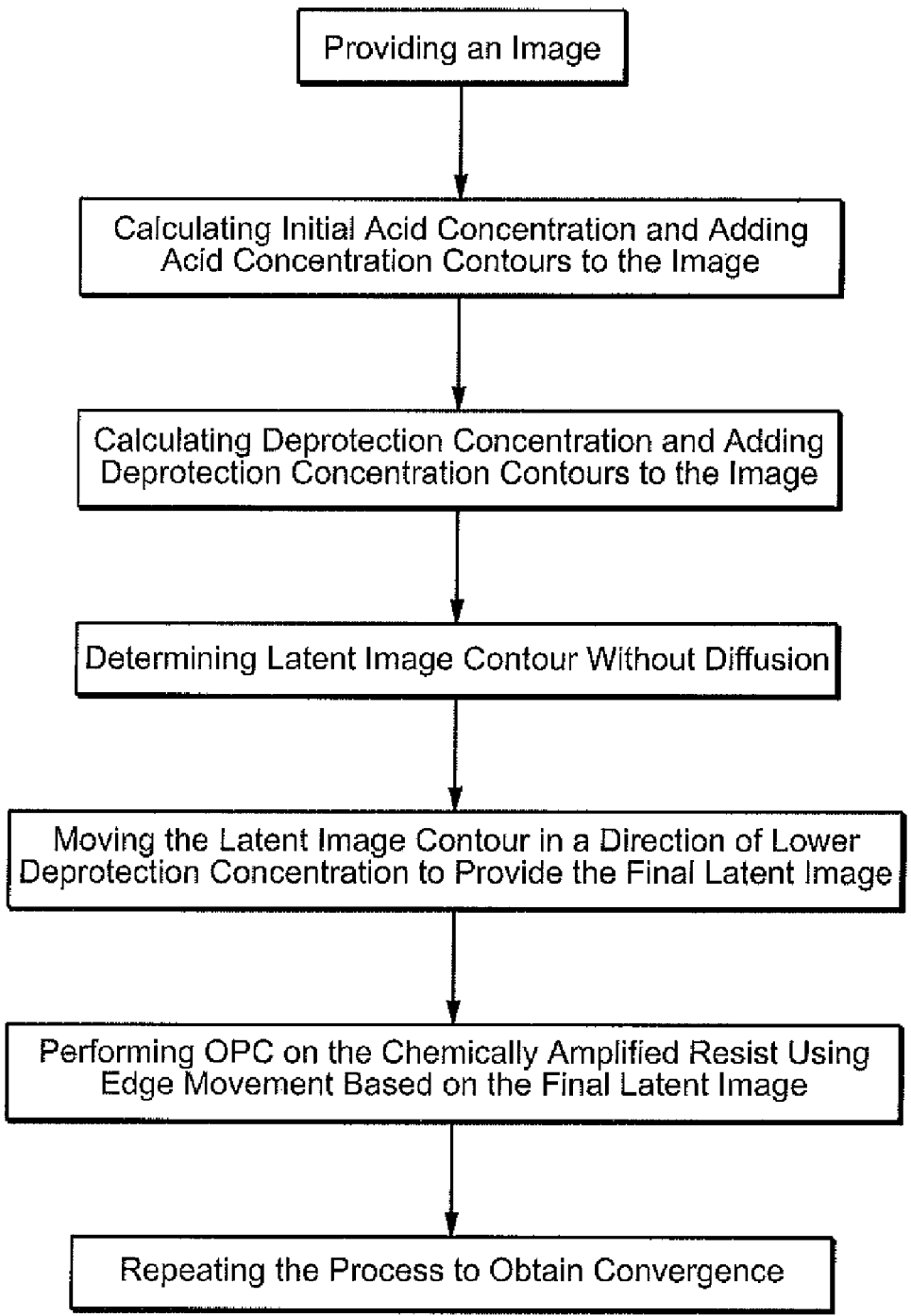
FIG. 1 is a flow chart which illustrates the steps of a method which is in accordance with an embodiment of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The present invention provides a method and system for utilizing a simplified resist process model to perform optical and process corrections. More specifically, the present invention provides a fast and easy post exposure bake (PEB) effects calculation which can be used in connection with OPC. The model can be used to increase OPC modeling accuracy, by taking PEB effects into consideration, without incurring a large overhead increase due to PEB calculation cost.

The following four equations describe the reaction diffusion kinetics of a chemically amplified (CA) resist during post exposure bake (PEB) process:

$$1. \frac{\partial A}{\partial t} = k_r(1-A)H$$

$$2. \frac{\partial H}{\partial t} = k_l HB + \nabla(D \nabla H)$$

$$3. \frac{\partial B}{\partial t} = k_l HB$$

$$4. D = D_0 \exp(\omega(1-A))$$

5. Equation 1 describes the deprotection (A) rate during the thermally induced cleavage of the normalized protecting groups (1-A) by the photogenerated acid (H). Equation 2 tracks changes in the acid concentration due to protected sites enhanced diffusion (Equation 4) and acid loss from base neutralization. Equation 3 tracks the base concentration. $k_r$ and $k_1$ are the reaction rate and acid loss rate constants, respectively. The diffusivity parameter, D, is non-Fickean and is assumed to be an exponential function of protected sites concentration. As such, the equations above require a nonlinear partial differential equations solver and are impractical for OPC applications due to the slow speed of solving partial differential equations.

6.

$$A(t)=1-\exp(-k_r Ht)$$

$$H(t)=C_1 \tan h(C_1 k_1 t - C_2) + C_1$$

$$B(t)=C_1 \tan h(C_1 k_1 t - C_2) - C_1$$

$$C_1=(H_0-B_0)/2$$

$$C_2=\operatorname{Tan} h^{-1}((H_0+B_0)/(B_0-H_0))$$

7. Equation 6 describes an analytical solution to the above equations 1-4 in the absence of diffusion, and is in accordance with an embodiment of the present invention

8.

$$dx/dt=(k_r D_0(1-A)(1-\omega)\exp(\omega(1-A)))^{1/2} \ (\omega<1)$$

9. Equation 8 describes the speed of reaction/diffusion interface when Equation 1-4 is cast in a traveling wave form 1-dimension, wherein A is the extent of deprotection, H is the acid concentration, B is the quencher concentration, dx/dt is the linewidth growth rate in the direction of lower deprotection concentration, and $D_0$ and $\omega$ are diffusion parameters. Equations 6 and 7 describe the resist latent image after post exposure bake process.

10.

$$H_0=1-\exp(-CE)=1-\exp(-CI_s t) \text{ where } t=D_e/I_0 \quad 10.$$

11. To perform OPC, the present invention provides that equation 10 is used to determine the initial acid concentration, wherein $I_0$ is intensity parameter, $D_e$ is exposure dose, t is time, $I_s$ is local intensity, and C is Dill C parameter.

12. Subsequently, equation 6 is used to calculate the deprotection concentration.
13. The threshold detector is used to determine the latent image contour without diffusion.
14. This contour is then moved in the direction of lower deprotection concentration by generalizing equation 8 to 2-dimension, i.e., $$xf=x_0-\alpha \partial I/\partial x$$

$$yf=y_0-\alpha \partial I/\partial y$$

where $\partial I/\partial x$ and $\partial I/\partial y$ are the normalized partial derivative of the intensity $$\alpha=t(k_r D_0(1-A)(1-\omega)\exp(\omega(1-A)))^{1/2}$$

This is the final latent image.
15. OPC is performed using standard edge movement techniques based on latent image edge from 13, above.
16. Repeat 11-14, above, until convergence.

Figure 2:
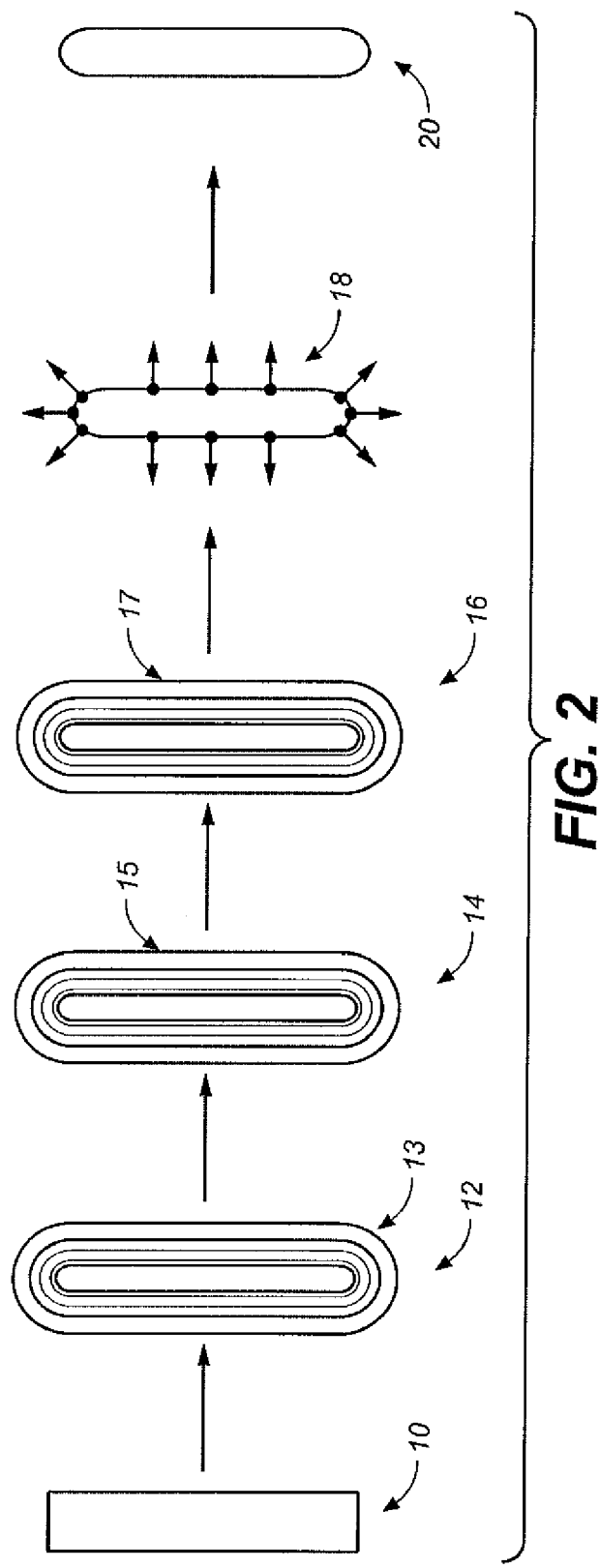
FIG. 2 shows steps of an embodiment of the present invention being effected on an image.

FIG. 1 corresponds to the above description, and illustrates the steps of the method which is in accordance with an embodiment of the present invention. FIG. 2 illustrates the steps being effected on an image to perform OPC. In FIG. 1, the initial feature is identified with reference numeral 10, reference numeral 12 identifies the image with intensity contours 13, reference numeral 14 identifies the image with acid concentration contours 15 (after step 10, described previous to this paragraph), reference numeral 16 identifies the image with deprotection concentration contours 17 (after step 12, described previous to this paragraph), reference numeral 18 identifies edge movement of the latent image from the threshold detector (after step 13, described previous to this paragraph), and reference numeral 20 identifies the final latent image (after step 14, described previous to this paragraph).

The above provides simplified equations for post exposure bake reaction/diffusion effects on latent image, which can be used for process model simulation applications as shown in FIGS. 1 and 2.

While embodiments of the present invention are shown and described, it is envisioned that those skilled in the art may devise various modifications of the present invention without departing from the spirit and scope of the appended claims.

What is claimed is:

1. A method of performing OPC on a chemically amplified resist in photolithography, said method comprising: providing an image; calculating initial acid concentration and adding acid concentration contours to the image; calculating deprotection concentration and adding deprotection concentration contours to the image; determining latent image contour without diffusion; moving the latent image contour in a direction of lower deprotection concentration to provide the final latent image; performing OPC on the chemically amplified resist using edge movement based on the final latent image; and repeating the process to obtain convergence.

2. A method as recited in claim 1, wherein post exposure bake effects are accounted for in the OPC.

3. A method as recited in claim 1, wherein the step of calculating initial acid concentration comprises using an equation which includes an intensity parameter, exposure dose, time, local intensity and Dill C parameter.

4. A method as recited in claim 1, wherein the step of calculating deprotection concentration comprises using equations which do not include a diffusivity parameter.

5. A method as recited in claim 3, wherein the step of calculating deprotection concentration comprises using equations which do not include a diffusivity parameter.

6. A method as recited in claim 1, wherein the step of calculating deprotection concentration comprises using equations which do not include a diffusivity parameter.

7. A method as recited in claim 1, wherein the step of calculating deprotection concentration comprises using the following equations $$A(t)=1-\exp(-k_r H t)$$

$$H(t)=C_1 \tanh(C_1 k_1 t - C_2) + C_1$$

$$B(t)=C_1 \tanh(C_1 k_1 t - C_2) - C_1$$

$$C_1 = (H_0 - B_0)/2$$

$$C_2 = \tanh^{-1}((H_0 + B_0)/(B_0 - H_0))$$

wherein A is the extent of deprotection, H is the acid concentration, B is the quencher concentration, $D_0$ and $\omega$ are diffusion parameters, $k_r$ is the reaction rate constant, C is the Dill C parameter, and t is time.

8. A method as recited in claim 1, wherein the step of determining latent image contour without diffusion comprises using a threshold detector.

9. A method as recited in claim 3, wherein the step of determining latent image contour without diffusion comprises using a threshold detector.

10. A method as recited in claim 1, wherein the step of determining latent image contour without diffusion comprises using a threshold detector.

11. A method as recited in claim 1, wherein the step of moving the latent image contour in a direction of lower deprotection concentration comprises using the following equation:

$$dx/dt = (k_r D_0 (1-A)(1-\omega)\exp(\omega(1-A)))^{1/2}$$

wherein dx/dt is the linewidth growth rate in the direction of lower deprotection concentration, $k_r$ is the acid loss rate constant, $D_0$ and $\omega$ are diffusion parameters, A is the extent of deprotection, and wherein $\omega < 1$.

12. A method as recited in claim 3, wherein the step of moving the latent image contour in a direction of lower deprotection concentration comprises using the following equation:

$$dx/dt = (k_r D_0 (1-A)(1-\omega)\exp(\omega(1-A)))^{1/2}$$

wherein dx/dt is the linewidth growth rate in the direction of lower deprotection concentration, $k_r$ is the acid loss rate constant, $D_0$ and $\omega$ are diffusion parameters, A is the extent of deprotection, and wherein $\omega < 1$.

13. A method as recited in claim 1, wherein the step of moving the latent image contour in a direction of lower deprotection concentration comprises using the following equation:

$$dx/dt = (k_r D_0 (1-A)(1-\omega)\exp(\omega(1-A)))^{1/2}$$

wherein dx/dt is the linewidth growth rate in the direction of lower deprotection concentrations $k_r$ is the acid loss rate constant, $D_0$ and $\omega$ are diffusion parameters, A is the extent of deprotection, and wherein $\omega < 1$.

* * * * *